United States Patent
Lee et al.

(10) Patent No.: US 12,356,837 B2
(45) Date of Patent: Jul. 8, 2025

(54) DISPLAY DEVICE INCLUDING A THIN FILM ENCAPSULATION LAYER AND A METHOD OF MANUFACTURING THE SAME

(71) Applicant: SAMSUNG DISPLAY CO., LTD., Yongin-si (KR)

(72) Inventors: Kyunghee Lee, Suwon-si (KR); Jeong Myo Sim, Gangneung-si (KR); Mihwa Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 542 days.

(21) Appl. No.: 17/585,111

(22) Filed: Jan. 26, 2022

(65) Prior Publication Data

US 2022/0238847 A1    Jul. 28, 2022

(30) Foreign Application Priority Data

Jan. 27, 2021    (KR) .................. 10-2021-0011479

(51) Int. Cl.
| | |
|---|---|
| *H10K 59/80* | (2023.01) |
| *H10K 50/844* | (2023.01) |
| *H10K 50/86* | (2023.01) |
| *H10K 59/12* | (2023.01) |
| *H10K 71/00* | (2023.01) |

(52) U.S. Cl.
CPC ......... *H10K 59/875* (2023.02); *H10K 50/844* (2023.02); *H10K 50/86* (2023.02); *H10K 59/12* (2023.02); *H10K 71/00* (2023.02); *H10K 59/1201* (2023.02); *H10K 59/8731* (2023.02); *H10K 59/8792* (2023.02)

(58) Field of Classification Search
CPC ...... H10K 50/86; H10K 50/844; H10K 59/12; H10K 71/00; H10K 59/1201; H10K 59/875; H10K 59/35; H10K 59/8731; H10K 59/8792

See application file for complete search history.

(56) References Cited

U.S. PATENT DOCUMENTS

| | | |
|---|---|---|
| 2004/0183433 A1 | 9/2004 | Cho et al. |
| 2015/0014640 A1 | 1/2015 | Son |
| 2016/0036002 A1 | 2/2016 | Seo et al. |

(Continued)

FOREIGN PATENT DOCUMENTS

| | | |
|---|---|---|
| KR | 10-2004-0079080 A | 9/2004 |
| KR | 10-0601381 | 7/2006 |

(Continued)

OTHER PUBLICATIONS

Jung et al., "Polarization Selective Color Filter based on Plasmonic Nanograting", American Chemical Society, 2020, pp. A-G.

(Continued)

*Primary Examiner* — Mohammad A Rahman
(74) *Attorney, Agent, or Firm* — F. CHAU & ASSOCIATES, LLC (57) ABSTRACT

A display device includes: a plurality of light emitting diodes emitting a light; a capping layer disposed on the plurality of light emitting diodes and including an organic material; and a plurality of metal patterns disposed on the capping layer and overlapping the plurality of light emitting diodes.

14 Claims, 10 Drawing Sheets

(56) References Cited

U.S. PATENT DOCUMENTS

2018/0261662 A1* 9/2018 Negishi ................ H10K 50/82
2019/0094616 A1* 3/2019 Kim ...................... G02B 6/0051

FOREIGN PATENT DOCUMENTS

| KR | 10-2010-0029885 | | 3/2010 |
| KR | 10-2011-0049476 | | 5/2011 |
| KR | 10-1076262 | | 10/2011 |
| KR | 10-2014-0131473 | | 11/2014 |
| KR | 10-2015-0006727 | A | 1/2015 |
| KR | 10-2016-0015524 | A | 2/2016 |
| KR | 10-2017-0084681 | | 7/2017 |

OTHER PUBLICATIONS

Office Action dated Dec. 10, 2025 from the Korean Intellectual Property Office (KIPO) for corresponding Korean Patent Application No. 10-2021-0011479.

* cited by examiner

DISPLAY DEVICE INCLUDING A THIN FILM ENCAPSULATION LAYER AND A METHOD OF MANUFACTURING THE SAME

CROSS-REFERENCE TO RELATED APPLICATION

This application claims priority under 35 USC § 119 to Korean Patent Application No. 10-2021-0011479 filed on Jan. 27, 2021 in the Korean Intellectual Property Office (KIPO), the disclosure of which is incorporated by reference herein in its entirety.

TECHNICAL FIELD

Embodiments of the present inventive concept relate to a display device. More particularly, embodiments of the present inventive concept relate to a display device including a thin film encapsulation layer and a method of manufacturing the display device.

DISCUSSION OF THE RELATED ART

Display devices are manufactured in various ways, and various types of display devices may be manufactured and used. For example, types of display devices that may be manufactured include an organic light emitting display device, a liquid crystal display device, or the like.

The display device may display an image on a screen and provide it to a user. In this case, as external light incident on the display device is reflected from the surface of the display device, the display quality of the display device may deteriorate. To prevent this, display devices typically include a polarizing film, a color filter, and the like may be used. In addition to this, display devices are under development to suppress reflection of external light.

SUMMARY

According to an embodiment of the present inventive concept, a display device, includes: a plurality of light emitting diodes emitting a light; a capping layer disposed on the plurality of light emitting diodes and including an organic material; and a plurality of metal patterns disposed on the capping layer and overlapping the plurality of light emitting diodes.

In an embodiment of the present inventive concept, the plurality of metal patterns include at least one of aluminum, silver, magnesium, chromium, titanium, nickel, silver, tantalum, copper, calcium, cobalt, iron, molybdenum, tungsten, platinum, ytterbium, or bismuth.

In an embodiment of the present inventive concept, the plurality of metal patterns include at least one of silicon oxide, titanium oxide, zirconium oxide, tantalum oxide, hafnium oxide, aluminum oxide, zinc oxide, yttrium oxide, beryllium oxide, magnesium oxide, lead oxide, tungsten oxide, silicon nitride, lithium fluoride, calcium fluoride, magnesium fluoride or cadmium sulfide.

In an embodiment of the present inventive concept, the plurality of light emitting diodes include: a first light emitting diode emitting light of a first color; a second light emitting diode emitting light of a second color; and a third light emitting diode emitting light of a third color.

In an embodiment of the present inventive concept, the plurality of metal patterns are arranged along a first direction and are spaced apart from each other in the first direction.

In an embodiment of the present inventive concept, the plurality of metal patterns are arranged to overlap the first, second and third light emitting diodes.

In an embodiment of the present inventive concept, a distance at which the plurality of metal patterns are separated from each other is about 1 micrometer or less.

In an embodiment of the present inventive concept, each of the plurality of metal patterns has a same width in the first direction as each other, and the width is about 1 micrometer or less.

In an embodiment of the present inventive concept, among the plurality of metal patterns, a first plurality of metal patterns overlap the first light emitting diode, and each of the first plurality of metal patterns has a first width in the first direction. Among the plurality of metal patterns, a second plurality of metal patterns overlap the second light emitting diode, and each of the second plurality of metal patterns has a second width in the first direction. Among the plurality of metal patterns, a third plurality of metal patterns overlap the third light emitting diode, and each of the third plurality of metal patterns has a third width in the first direction. Each of the first, second and third widths is about 1 micrometer or less.

In an embodiment of the present inventive concept, a shortest distance between the plurality of metal patterns and the plurality of light emitting diodes is about 1 micrometer or less.

In an embodiment of the present inventive concept, the display device further includes: a thin film encapsulation layer disposed on the plurality of metal patterns, and wherein the thin film encapsulation layer includes: a first inorganic encapsulation layer disposed on the plurality of metal patterns; an organic encapsulation layer disposed on the first inorganic encapsulation layer; and a second inorganic encapsulation layer disposed on the organic layer.

In an embodiment of the present inventive concept, the display device further includes: a transistor substrate including a plurality of transistors, and electrically connected to the plurality of light emitting diodes disposed on the transistor substrate, and wherein each of the plurality of light emitting diodes includes: an anode electrode disposed on the transistor substrate; a light emitting layer disposed on the anode electrode; and a cathode electrode disposed on the light emitting layer.

In an embodiment of the present inventive concept, each of the plurality of metal patterns includes an upper surface and a lower surface, wherein an external light incident on the plurality of metal patterns is reflected as a first reflected light from the upper surface, wherein the external light is reflected as a second reflected light from the lower surface, and wherein the first reflected light and the second reflected light interfere with each other.

In an embodiment of the present inventive concept, the capping layer includes an acrylic organic material.

According to an embodiment of the present inventive concept, a method of manufacturing a display device includes: forming a pixel including a transistor and a light emitting diode disposed on the transistor and connected to the transistor; forming a capping layer on the light emitting diode, wherein the capping layer includes an organic material; forming a metal layer on the capping layer; patterning the metal layer to form a plurality of metal patterns; and forming a thin film encapsulation layer on the plurality of metal patterns.

In an embodiment of the present inventive concept, the plurality of metal patterns include at least one of aluminum, silver, magnesium, chromium, titanium, nickel, silver, tantalum, copper, calcium, cobalt, iron, molybdenum, tungsten, platinum, ytterbium, or bismuth.

In an embodiment of the present inventive concept, the plurality of metal patterns include at least one of silicon oxide, titanium oxide, zirconium oxide, tantalum oxide, hafnium oxide, aluminum oxide, zinc oxide, yttrium oxide, beryllium oxide, magnesium oxide, lead oxide, tungsten oxide, silicon nitride, lithium fluoride, calcium fluoride, magnesium fluoride or cadmium sulfide.

In an embodiment of the present inventive concept, the plurality of metal patterns are arranged along a first direction and are spaced apart from each other in the first direction.

In an embodiment of the present inventive concept, a distance at which the plurality of metal patterns are separated from each other is about 1 micrometer or less, wherein each of the plurality of metal patterns has a same width in the first direction as each other, and wherein the width is about 1 micrometer or less.

In an embodiment of the present inventive concept, each of the plurality of metal patterns includes an upper surface and a lower surface, wherein an external light incident on the plurality of metal patterns is reflected as a first reflected light from the upper surface, wherein the external light is reflected as a second reflected light from the lower surface, and wherein the first reflected light and the second reflected light interfere with each other.

BRIEF DESCRIPTION OF THE DRAWINGS

The above and other features of the present inventive concept will become more apparent by describing in detail embodiments thereof, with reference to the accompanying drawings, in which.

DETAILED DESCRIPTION OF THE EMBODIMENTS

Hereinafter, display devices in accordance with embodiments of the present inventive concept will be explained in detail with reference to the accompanying drawings.

Figure 1:
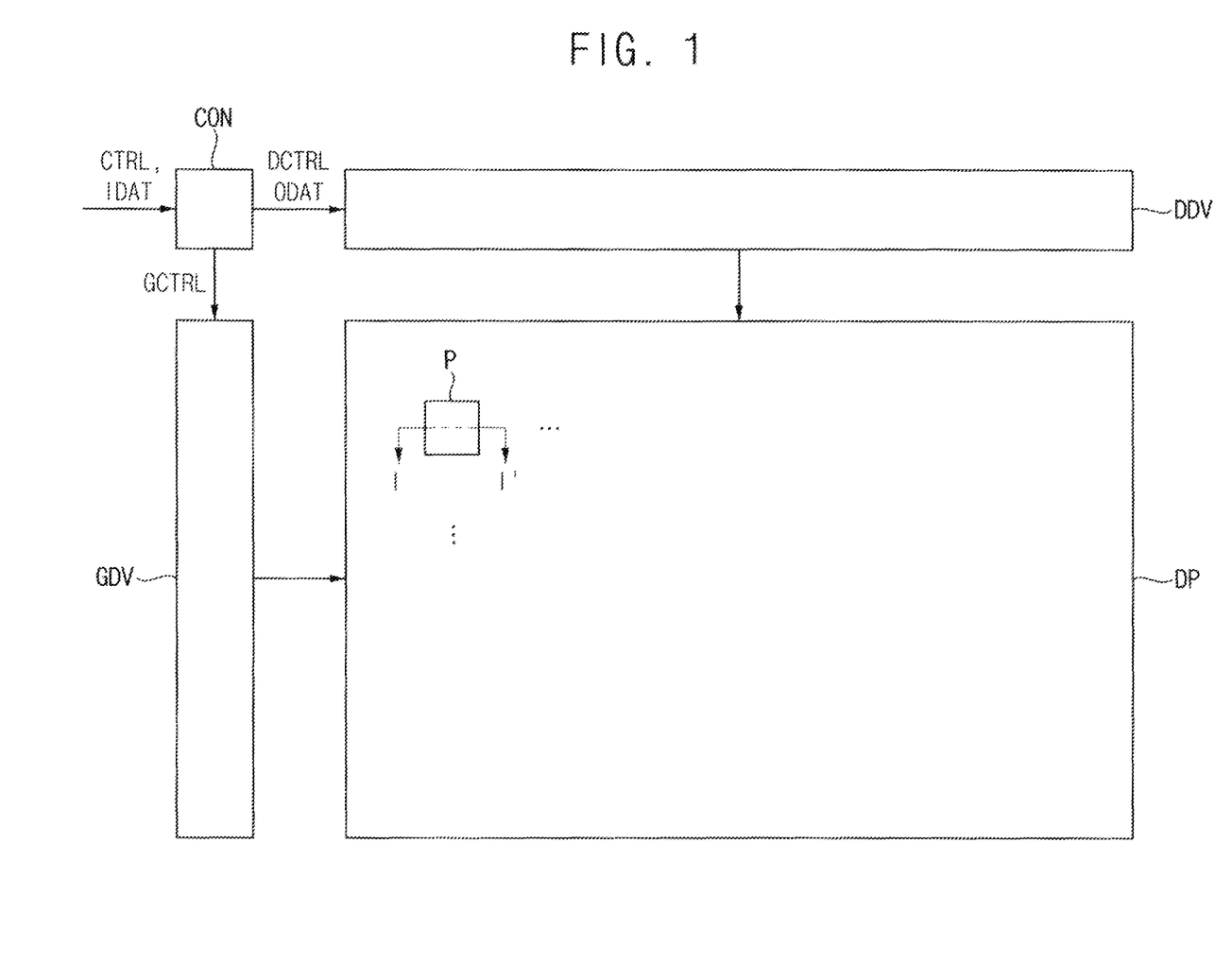
FIG. 1 is a block diagram illustrating a display device according to an embodiment of the present inventive concept.

FIG. 1 is a block diagram illustrating a display device according to an embodiment of the present inventive concept.

Referring to FIG. 1, the display device may include a display panel DP including a plurality of pixels P, a data driver DDV, a gate driver GDV, and a timing controller CON.

The display device may display an image through the display panel DP. To this end, the display panel DP may include a plurality of pixels P and light emitting elements connected to the pixels. In an embodiment of the present inventive concept, the display panel DP may be configured as a single panel. In addition, in an embodiment of the present inventive concept, the display panel DP may include a plurality of panels.

The timing controller CON may generate a gate control signal GCTRL, a data control signal DCTRL, and an output image data ODAT based on a control signal CTRL and an input image data IDAT provided from the outside (e.g., an external device). For example, the control signal CTRL may include a vertical synchronization signal, a horizontal synchronization signal, an input data enable signal, a master clock signal, and the like. For example, the input image data IDAT may be RGB data including red image data, green image data, and blue image data. In addition, the input image data IDAT may include magenta image data, cyan image data, and yellow image data.

The gate driver GDV may generate gate signals based on the gate control signal GCTRL provided from the timing controller CON. For example, the gate control signal GCTRL may include a vertical start signal, a clock signal, and the like. In an embodiment of the present inventive concept, the gate driver GDV may be manufactured as a separate panel and connected to the display panel DP. The gate driver GDV is electrically connected to the display panel DP and may sequentially output the gate signals. Each of the pixels may receive a data voltage according to the control of each of the gate signals.

The data driver DDV may generate the data voltage based on the data control signal DCTRL and the output image data ODAT provided from the timing controller CON. For example, the data control signal DCTRL may include an output data enable signal, a horizontal start signal, and a load signal. In an embodiment of the present inventive concept, the data driver DDV may be manufactured as a separate panel and electrically connected to the display panel DP. The data driver DDV is electrically connected to the display panel DP and may generate a plurality of data voltages. Each of the pixels P may receive a signal for luminance corresponding to each of the data voltages so that the light emitting element of each of the pixels P may emit light corresponding to the data voltages.

Figure 2:
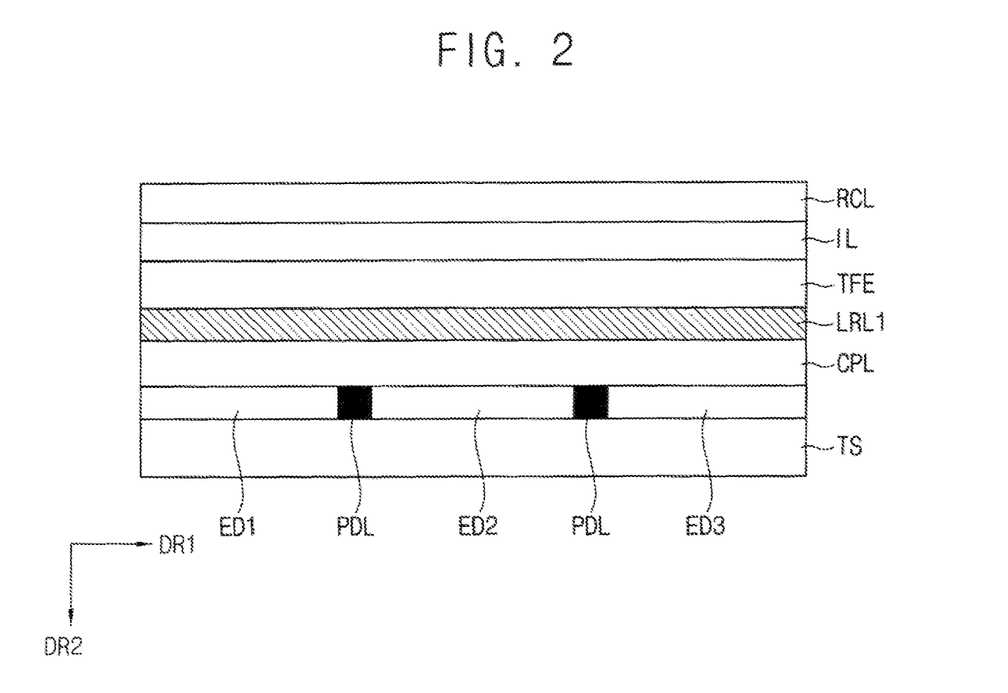
FIG. 2 is a cross-sectional view schematically illustrating an embodiment of a cross-section taken along the line I-I' of FIG. 1.
Figure 3:
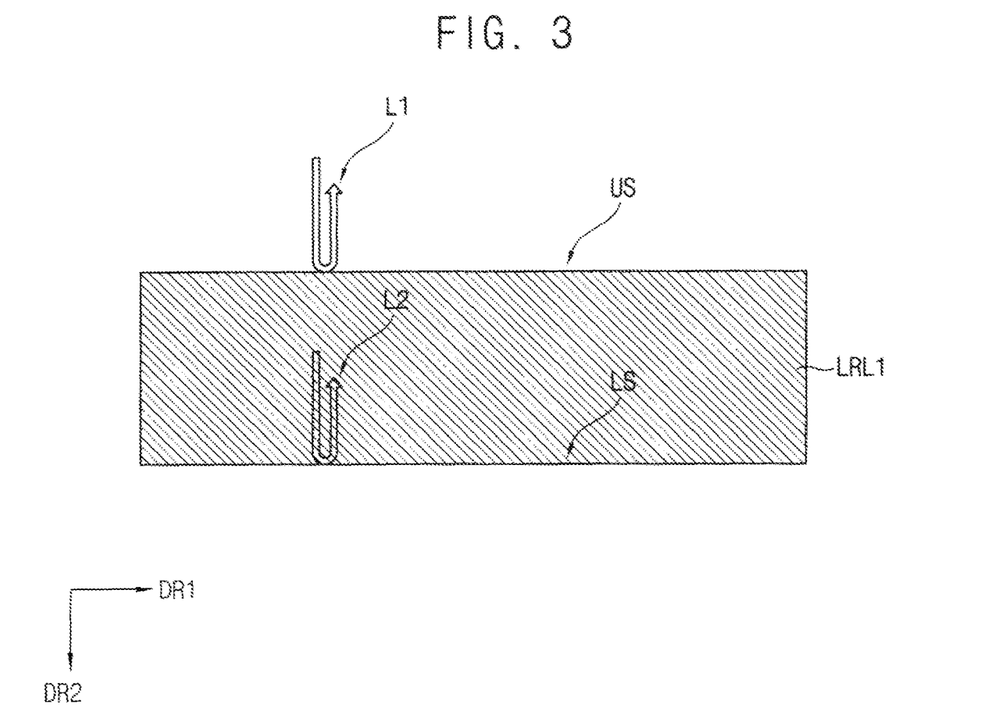
FIG. 3 is a plan view illustrating an embodiment of the metal layer of FIG. 2.

FIG. 2 is a cross-sectional view schematically illustrating an embodiment of a cross-section taken along the line I-I' of FIG. 1. FIG. 3 is a plan view illustrating an embodiment of the metal layer of FIG. 2.

Referring to FIGS. 1 to 3, the display device may include a transistor substrate TS, light emitting diodes ED1, ED2, ED3, a pixel defining layer PDL, a capping layer CPL, a first metal layer LRL1, a thin film encapsulation layer TFE, an insulating layer IL, and an organic material layer RCL.

The transistor substrate TS may include a plurality of transistors. The transistors may transmit signals to the light emitting diodes ED1, ED2, ED3. The light emitting diodes ED1, ED2, ED3 may emit light based on the received signals. To this end, the light emitting diodes ED1, ED2, ED3 may be electrically connected to the plurality of transistors. In an embodiment of the present inventive concept, each of the light emitting diodes ED1, ED2, ED3 may be an organic light emitting diode.

In an embodiment of the present inventive concept, a first light emitting diode ED1 may emit light of a first color. A second light emitting diode ED2 may emit light of a second color, and a third light emitting diode ED3 may emit colored light. For example, the first color may be red light, and the second color may be green light. As an additional example, the third color may be blue light. However, this is merely an example, and the colors of light emitted by the light emitting diodes ED1, ED2, ED3 are not limited thereto. The light emitting diodes ED1, ED2, ED3 may be defined by the pixel defining layer PDL. For example, the light emitting diodes ED1, ED2 and ED3 may be surrounded by the pixel defining layer PDL.

The capping layer CPL may be disposed on the light emitting diodes ED1, ED2, ED3 and the pixel defining layer PDL. The capping layer CPL may include an insulating material. In an exemplary embodiment of the present inventive concept, the capping layer CPL may include an organic insulating material. For example, the organic insulating material may include an epoxy resin, an acrylic resin, a phenol resin, a melamine resin, a cardo resin, an imide resin, and the like. For example, the organic insulating material may include an acrylic organic material. In an embodiment of the present inventive concept, the capping layer CPL may be disposed to extend in a first direction DR1. In addition, the capping layer CPL may have a thickness in a second direction substantially perpendicular to the first direction DR1. The thickness may be about 1 micrometer or less. For example, the shortest distance between the first metal layer LRL1 and the light emitting diodes ED1, ED2, ED3 may be about 1 micrometer or less. For example, the thickness may be about 10 to 200 nanometers. When the thickness of the capping layer CPL exceeds 1 micrometer, the first metal layer LRL1 might not efficiently transmit light emitted from the light emitting diodes ED1. ED2, ED3.

The first metal layer LRL1 may be disposed on the capping layer CPL. The first metal layer LRL1 may include an upper surface US and a lower surface LS. External light incident on the display device may be reflected from the upper surface US and the lower surface LS. In this case, a phase difference may occur between a first reflected light L1 reflected from the upper surface US and a second reflected light L2 reflected from the lower surface LS. Accordingly, the first reflected light L1 and the second reflected light L2 may cause destructive interference with each other. Accordingly, the display device may prevent deterioration of display quality caused by reflection of the external light.

In addition, according to an embodiment of the present inventive concept, since the first metal layer LRL1 suppresses reflection of external light, a separate polarizing film might not be needed. Accordingly, it is possible to reduce the thickness of the display device and increase the flexibility of the display device.

The thin film encapsulation layer TFE may be disposed on the first metal layer LRL1. The thin film encapsulation layer TFE may prevent external foreign substances from penetrating into the light emitting diodes ED), ED2, ED3. In addition, the thin film encapsulation layer TFE may protect the light emitting diodes ED1, ED2, ED3 from external impact.

The insulating layer IL may be disposed on the thin film encapsulation layer TFE. The insulating layer IL may include an insulating material. For example, the insulating layer may include an inorganic insulating material or an organic insulating material. The inorganic insulating material may include, for example, silicon oxide, silicon nitride, silicon oxynitride, tantalum oxide, and the like. The organic insulating material may include, for example, photoresist, polyacrylic resin, polyimide resin, acrylic resin, and the like. The insulating layer IL is illustrated as a single layer, but may include a plurality of insulating layers. In this case, conductive layers may be disposed between the insulating layers, and the insulating layers may include inorganic insulating layers and/or organic insulating layers.

An organic material layer RCL may be disposed on the insulating layer IL. The organic material layer RCL may include an organic material. For example, the organic material may include a heat curable resin, a UV curable resin, and the like. The organic material layer RCL may further include, for example, a pigment, a dye, or the like. Through this, the organic material layer RCL may absorb light of a specific wavelength to increase display quality of the display device. For example, the organic material layer RCL may absorb external light reflected from the bottom of the display device. In addition, the organic material layer RCL may absorb light in a wavelength band other than light emitted to the outside among light emitted from the bottom of the display device. The organic material layer RCL may have a flat top surface. To this end, the organic material layer RCL may undergo a planarization process.

Figure 4A:
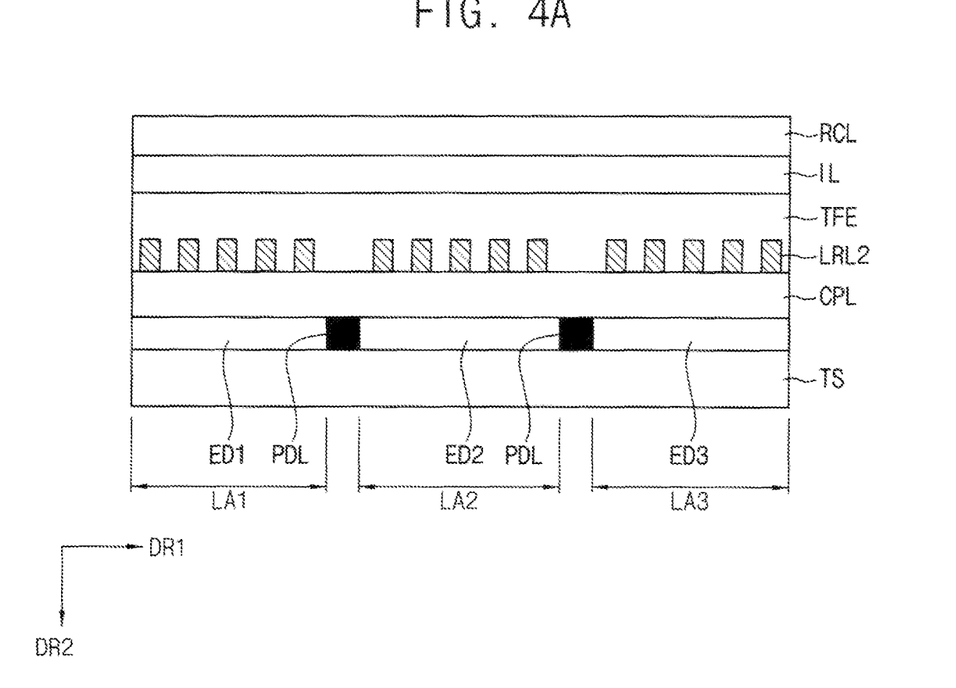
FIGS. 4A and 4B are cross-sectional views schematically illustrating an embodiment of a cross-section taken along line I-I' of FIG. 1.
Figure 4B:
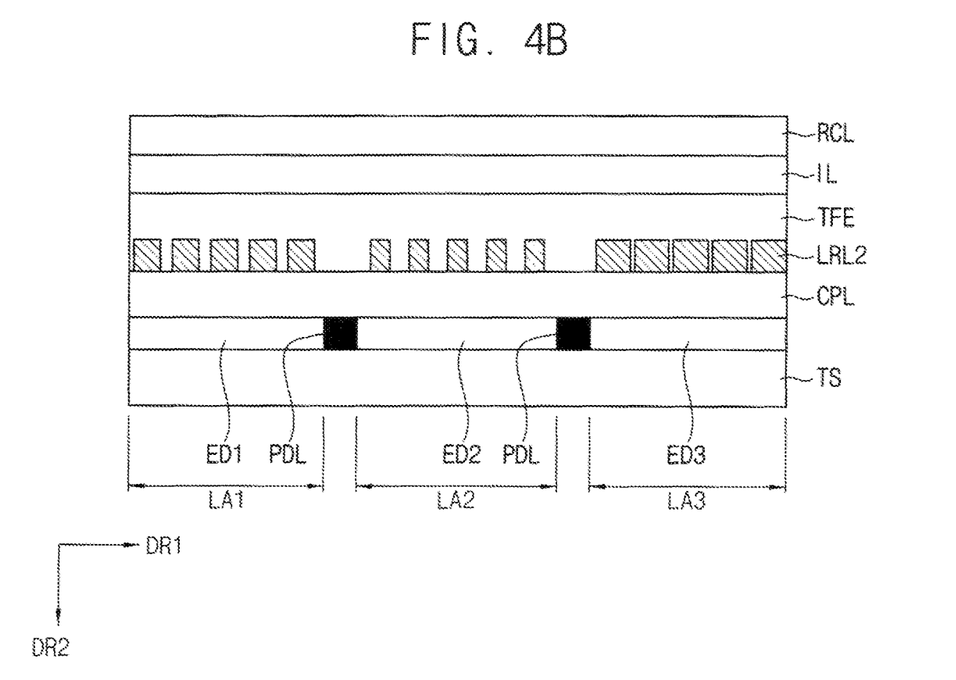

FIGS. 4A and 4B are cross-sectional views schematically illustrating an embodiment of a cross-section taken along line I-I' of FIG. 1. FIGS. 4A and 4B may be substantially the same as that of FIG. 3 except that a second metal layer LRL2 is patterned. Accordingly, a description of overlapping elements and configurations will be omitted.

Referring to FIGS. 1 and 4A, the second metal layer LRL2 may include a plurality of metal patterns. The metal patterns may be disposed to be spaced apart from each other in the first direction DR1. The distance between the metal patterns may be about 1 micrometer or less. In addition, the metal patterns may have the same width in the first direction DR1 as each other. The metal patterns may be disposed to overlap the light emitting diodes ED1, ED2, ED3 and to not overlap the pixel defining layer PDL. For example, the shortest distance between the second metal layer LRL2 and the light emitting diodes ED1, ED2, ED3 may be about 1 micrometer or less. Accordingly, the metal patterns may selectively transmit light emitted from the light emitting diodes ED1, ED2, ED3 to increase display quality of the display device. Accordingly, in the present inventive concept, a separate color filter or the like may not be needed.

In an embodiment of the present inventive concept, a degree of transmission of light emitted from the light emitting diodes ED1, ED2, ED3 may vary according to the width of the metal patterns. For example, the light of a color that has the greatest influence on the display quality of the display device may be green light. Accordingly, the metal patterns may be patterned to have a width for best transmitting the green light.

In addition, as illustrated in FIG. 4B, at least one of the metal patterns of the second metal layer LRL2 may have a different width in the first direction DR1 than the remaining metal patterns. For example, the metal patterns overlapping the first light emitting diode ED1 may have a first width, and accordingly, gaps with a first predetermined distance may be formed between the metal patterns overlapping the first light emitting diode ED1. The metal patterns overlapping the second light emitting diode ED2 may have a second width, and accordingly, gaps with a second predetermined distance may be formed between the metal patterns overlapping the second light emitting diode ED2. The metal patterns overlapping the third light emitting diode ED3 may have a third width, and accordingly, gaps with a third predetermined distance may be formed between the metal patterns overlapping the third light emitting diode ED3. The first, second and third widths may be different from each other, and the first, second and third predetermined distances may be different from each other. Accordingly, the metal patterns selectively transmit wavelengths of light emitted by the light emitting diodes ED1, ED2, ED3, respectively, thereby increasing display quality of the display device.

The metal patterns overlapping the first light emitting diode ED1 may include the first width and gaps therebetween for selectively transmitting light emitted from the first light emitting diode ED1. The metal patterns overlapping the second light emitting diode ED2 may include the second width and gaps therebetween for selectively transmitting light emitted from the second light emitting diode ED2. The metal patterns overlapping the third light emitting diode ED3 may include the third width and gaps therebetween for selectively transmitting light emitted from the third light emitting diode ED3.

As such, the second metal layer LRL2 selectively transmits light emitted from the light emitting diodes ED1, ED2, ED3, thereby increasing light efficiency of the display device.

Figure 5A:
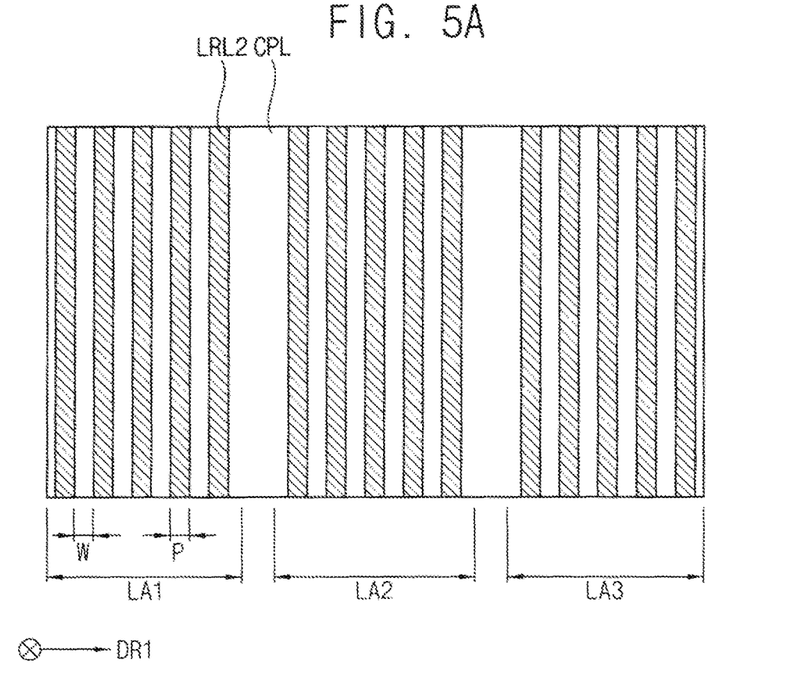
FIG. 5A is a plan view illustrating an embodiment of the metal layer of FIG. 4A.
Figure 5B:
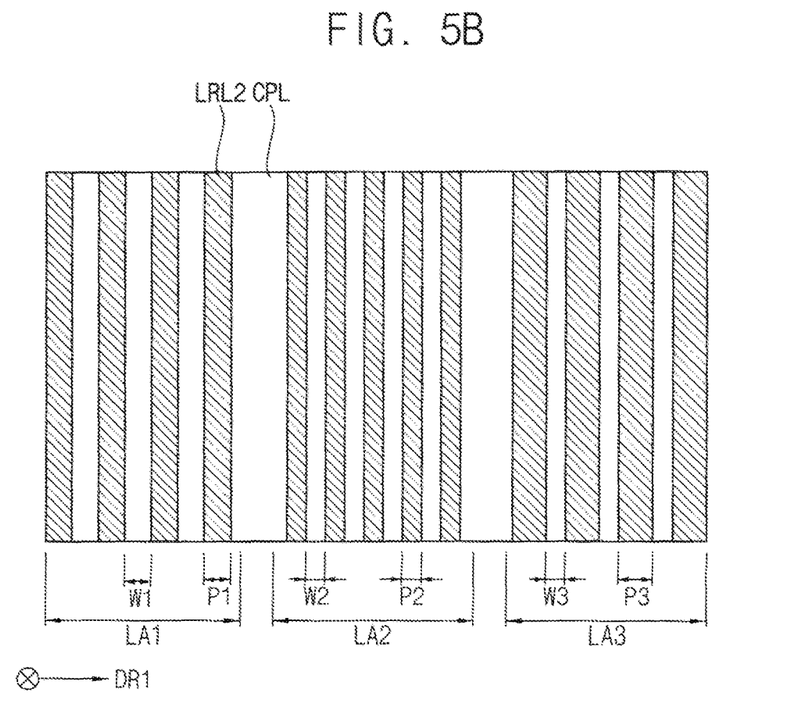
FIG. 5B is a plan view illustrating an embodiment of the metal layer of FIG. 4B.

FIG. 5A is a plan view illustrating an embodiment of the metal layer of FIG. 4A, and FIG. 5B is a plan view illustrating an embodiment of the metal layer of FIG. 4B.

Referring to FIGS. 4A and 5A, each of the metal patterns may be disposed to be spaced apart from each other by a predetermined distance W in the first direction DR1. In addition, each of the metal patterns may have a constant width P in the first direction DR1.

Referring to FIGS. 4B and 5B, the metal patterns in the first light emitting area LA1 may be disposed to be spaced apart from each other by a first distance W1. In addition, the metal patterns may have a first width P1 in the first light emitting area LA1. The metal patterns in the second light emitting area LA2 may be disposed to be spaced apart from each other by a second distance W2. In addition, the metal patterns may have a second width P2 in the second light emitting area LA2. The metal patterns in the third light emitting area LA3 may be disposed to be spaced apart from each other by a third distance W3. In addition, the metal patterns may have a third width P3 in the third light emitting area LA3.

In an embodiment of the present inventive concept, the distances W1, W2, W3 may be different from each other. In addition, the widths P1, P2, P3 may be different from each other.

Figure 6:
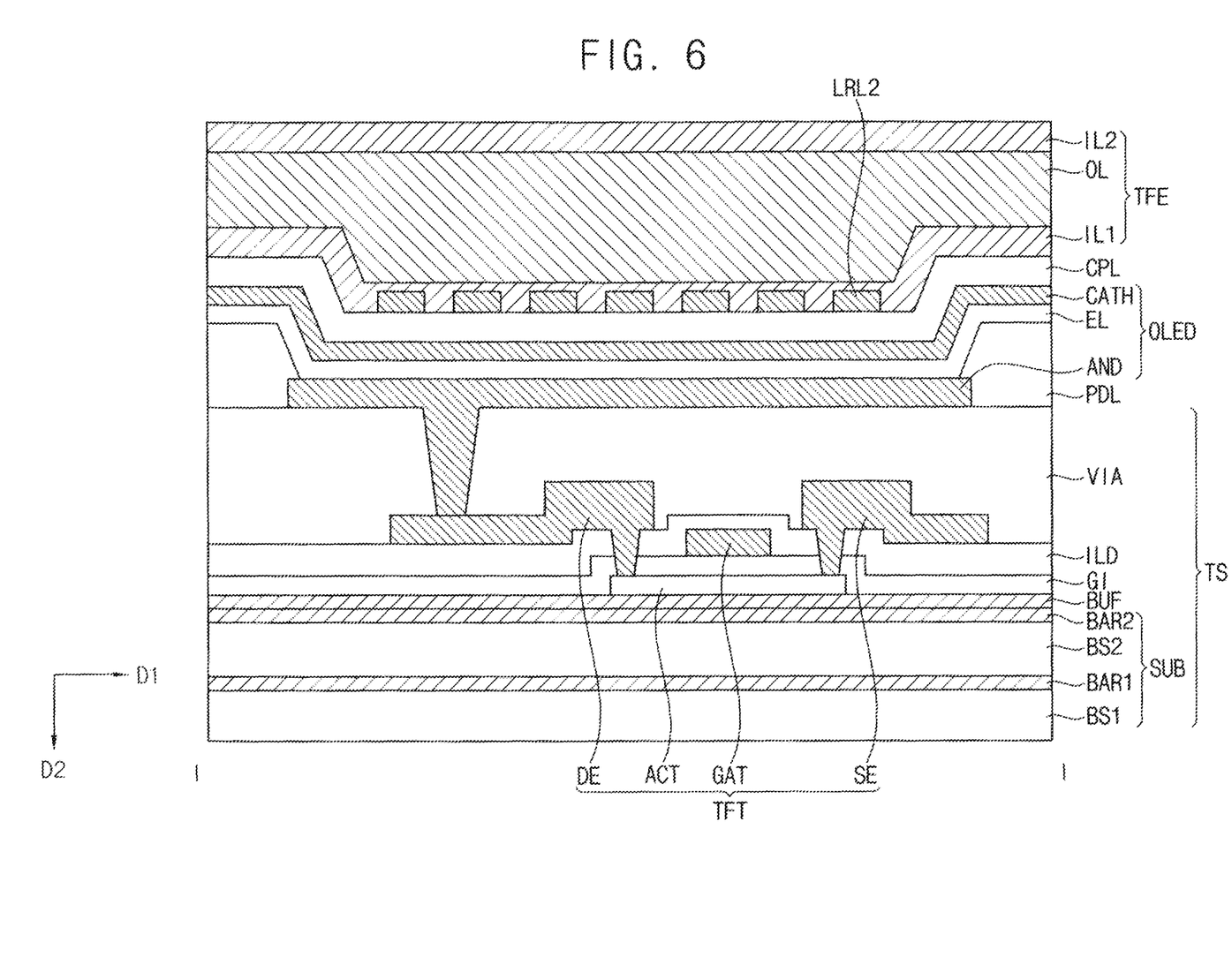
FIG. 6 is a cross-sectional view illustrating an embodiment of a cross-section taken along the line I-I' of FIG. 1.

FIG. 6 is a cross-sectional view illustrating an embodiment of a cross-section taken along the line I-I' of FIG. 1.

Referring to FIGS. 1 and 6, the display device may include a substrate SUB, a buffer layer BUF, a gate insulating layer GI, an interlayer insulating layer ILD, a via insulating layer VIA, a transistor TFT, a pixel defining layer PDL, and an organic light emitting diode OLED, a capping layer CPL, a second metal layer LRL2, and a thin film encapsulation layer TFE.

The transistor TFT may include an active layer ACT, a gate electrode GAT, a source electrode SE, and a drain electrode DE. The organic light emitting diode OLED may include an anode electrode AND, a light emitting layer EL, and a cathode electrode CATH. The thin film encapsulation layer TFE may include a first inorganic encapsulation layer IL1, an organic encapsulation layer OL, and a second inorganic encapsulation layer IL2.

The substrate SUB may include a plurality of layers. For example, the substrate SUB may have a structure in which a first base substrate BS1, a first barrier layer BAR1, a second base substrate BS2, and a second barrier layer BAR2 are stacked.

In an embodiment of the present inventive concept, the first base substrate BS1 may have rigid characteristics. In this case, the first base substrate BS1 may include, for example, glass, quartz, or the like. In addition, in an embodiment of the present inventive concept, the first base substrate BS1 may have a flexible characteristic. In this case, the first base substrate BS1 may include, for example, plastic or the like. For example, the first base substrate BS1 may include polyimide.

The first barrier layer BAR1 may be disposed on the first base substrate SUB1. The first barrier layer BAR1 may include an organic material and/or an inorganic material. In an embodiment of the present inventive concept, the first barrier layer BAR1 may include, for example, silicon oxide ("SiOx"), silicon nitride ("SiNx"), silicon oxynitride ("SiOxNy"), or the like. The first barrier layer BAR1 may prevent diffusion of impurities from the first base substrate SUB1 to the transistor TFT. In addition, the first barrier layer BAR1 may protect the transistor TFT from external impact.

The second base substrate BS2 may be disposed on the first barrier layer BAR). The second base substrate BS2 may include substantially the same material as the first base substrate BS1.

The second barrier layer BAR2 may be disposed on the second base substrate BS2. The second barrier layer BAR2 may include substantially the same material as the first barrier layer BAR1.

The buffer layer BUF may be disposed on the second barrier layer BAR2. For example, the buffer layer BUF may include silicon oxide ("SiOx"), silicon nitride ("SiNx"), silicon oxynitride ("SiOxNy"), or the like. The buffer layer BUF may prevent metal atoms or impurities from diffusing into the active layer ACT. In addition, the buffer layer BUF may control the transmission of heat provided to the active layer ACT during a crystallization process for forming the active layer ACT.

The active layer ACT may be disposed on the buffer layer BUF. In an embodiment of the present inventive concept, the active layer ACT may include a silicon semiconductor. For example, the active layer ACT may include amorphous silicon, polycrystalline silicon, or the like. In addition, in an embodiment of the present inventive concept, the active layer ACT may include an oxide semiconductor. For example, the active layer ACT may include indium-gallium-zinc oxide ("IGZO"), indium-gallium oxide ("IGO"), and indium-zinc oxide ("IZO").

The gate insulating layer GI may be disposed on the buffer layer BUF. The gate insulating layer GI may be disposed to cover the active layer ACT. The gate insulating layer GI may include an insulating material. For example, the gate insulating layer GI may include silicon oxide ("SiOx"), silicon nitride ("SiNx"), silicon oxynitride ("SiOxNy"), or the like.

The gate electrode GAT may be disposed on the gate insulating layer GI. The gate electrode GAT may overlap the active layer ACT. In response to a gate signal provided to the gate electrode GAT, a signal and/or a voltage may flow through the active layer ACT. In an embodiment of the present inventive concept, the gate electrode GAT may include a metal, an alloy, a metal oxide, a transparent conductive material, or the like. For example, the gate electrode GAT may include silver ("Ag"), an alloy containing silver, molybdenum ("Mo"), an alloy containing molybdenum, aluminum ("Al"), an alloy containing aluminum, and aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), Scandium ("Sc"), indium tin oxide ("ITO"), indium zinc oxide ("IZO"), and the like.

The interlayer insulating layer ILD may be disposed on the gate insulating layer GI. The interlayer insulating layer ILD may be disposed to cover the gate electrode GAT. In an embodiment of the present inventive concept, the interlayer insulating layer ILD may include an insulating material. For example, the interlayer insulating layer ILD may include silicon oxide ("SiOx"), silicon nitride ("SiNx"), silicon oxynitride ("SiOxNy"), or the like.

The source electrode SE and the drain electrode DE may be disposed on the interlayer insulating layer ILD. The source electrode SE and the drain electrode DE may contact the active layer ACT. In an embodiment of the present inventive concept, the source electrode SE and the drain electrode DE may include a metal, an alloy, a metal oxide, a transparent conductive material, and the like. For example, the source electrode SE and the drain electrode DE may include silver ("Ag"), an alloy containing silver, molybdenum ("Mo"), an alloy containing molybdenum, aluminum ("Al"), an alloy containing aluminum, and aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), Scandium ("Sc"), indium tin oxide ("ITO"), indium zinc oxide ("IZO"), and the like.

The via insulating layer VIA may be disposed on the interlayer insulating layer ILD. The via insulating layer VIA may be disposed to cover the source electrode SE and the drain electrode DE. In an embodiment of the present inventive concept, the via insulating layer VIA may include an organic insulating material. Accordingly, the via insulating layer VIA may have a substantially flat top surface. For example, the via insulating layer VIA may include a photoresist, a polyacrylic resin, a polyimide resin, an acrylic resin, or the like.

The first base substrate BS1 to the via insulating layer VIA may constitute the transistor substrate TS.

The anode electrode AND may be disposed on the via insulating layer VIA. The anode electrode AND may contact the drain electrode DE through a via penetrating the via insulating layer VIA. In an embodiment of the present inventive concept, the anode electrode AND may include a metal, an alloy, a metal oxide, a transparent conductive material, or the like. For example, the anode electrode AND may include silver ("Ag"), an alloy containing silver, molybdenum ("Mo"), an alloy containing molybdenum, aluminum ("Al"), an alloy containing aluminum, and aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), Scandium ("Sc"), indium tin oxide ("ITO"), indium zinc oxide ("IZO"), and the like.

The pixel defining layer PDL may be disposed on the via insulating layer VIA. An opening exposing the anode electrode AND may be formed in the pixel defining layer PDL. In an embodiment of the present inventive concept, the pixel defining layer PDL may include an organic material. For example, the pixel defining layer PDL may include a photoresist, a polyacrylic resin, a polyimide resin, an acrylic resin, or the like.

The light emitting layer EL may be disposed on the anode electrode AND. The light emitting layer EL may include an organic material emitting light of a predetermined color. The light emitting layer EL may emit the light based on a potential difference between the anode electrode AND and the cathode electrode CATH.

In addition, the light emitting layer EL may include at least one of a hole injection layer, a hole transport layer, an electron transport layer, and an electron injection layer.

The cathode electrode CATH may be disposed on the light emitting layer EL. The cathode electrode CATH may include, for example, a metal, an alloy, a metal oxide, a transparent conductive material, or the like. For example, the cathode electrode CATH may include silver ("Ag"), an alloy containing silver, molybdenum ("Mo"), an alloy containing molybdenum, aluminum ("Al"), an alloy containing aluminum, and aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), Scandium ("Sc"), indium tin oxide ("ITO"), indium zinc oxide ("IZO"), and the like.

The capping layer CPL may be disposed on the cathode electrode CATH. The capping layer CPL may include an organic layer and an inorganic layer.

The organic layer of the capping layer CPL may be disposed along the profile of the cathode electrode CATH. Accordingly, the organic layer may increase light extraction efficiency of the light emitted from the light emitting layer EL. The organic layer may include organic materials such as a-NPD, NPB, TPD, m-MTDATA, Alq3, and CuPc.

The inorganic layer may be disposed on the organic layer. The inorganic layer may protect the organic layer from external impact. The inorganic layer may include lithium fluoride ("LiF").

The second metal layer LRL2 may be disposed on the capping layer CPL. External light may enter the display device. The external light may be extinguished in the second metal layer LRL2. In an embodiment of the present inventive concept, the second metal layer LRL2 may cancel the external light by using a phase difference of the external light reflected from an upper surface and a lower surface of the second metal layer LRL2. For example, the external light may be divided into a first light reflected from an upper surface of the second metal layer LRL2 and a second light reflected from a lower surface of the second metal layer LRL2. Phases of the first light and the second light may be opposite to each other. Accordingly, since the first light and the second light cancel each other and disappear, the external light reflected from the outside of the display device may not be visually recognized. Accordingly, the display quality of the display device may be increased. For example, since the external light is not reflected, the display device may effectively display a black image.

In an embodiment of the present inventive concept, the second metal layer LRL2 may include, for example, ytterbium (Yb). In addition, in an embodiment of the present inventive concept, the second metal layer LRL2 may include, for example, bismuth (Bi). In addition, the second metal layer LRL2 may include, for example, aluminum ("Al"), silver ("Ag"), magnesium ("Mg"), chromium ("Cr"), titanium ("Ti"), nickel ("Ni"), gold ("Au"), tantalum ("Ta"), Copper ("Cu"), calcium ("Ca"), cobalt ("Co"), iron ("Fe"), molybdenum ("Mo"), tungsten ("W"), platinum ("Pt") and the like. In addition, the second metal layer LRL2 may include, for example, silicon oxide, titanium oxide, zirconium oxide, tantalum oxide, hafnium oxide, aluminum oxide, zinc oxide, yttrium oxide, beryllium oxide, magnesium oxide, lead oxide, tungsten oxide, silicon nitride, lithium fluoride, calcium fluoride, magnesium fluoride, and the like.

Since the capping layer CPL is disposed between the second metal layer LRL2 and the cathode electrode CATH, the metal layer LRL2 and the cathode electrode CATH use an etalon effect to amplify a light having a specific wavelength range. Accordingly, light efficiency of the display device may be increased.

The second metal layer LRL2 is illustrated as being disposed to overlap the opening formed in the pixel defining layer PDL, but the present inventive concept is not limited thereto. For example, the second metal layer LRL2 may be entirely disposed on the capping layer CPL.

The thin film encapsulation layer TFE may be disposed on the second metal layer LRL2. The first inorganic encapsulation layer IL1 may be disposed on the second metal layer LRL2 to cover the second metal layer LRL2. The first inorganic encapsulation layer IL1 may include, for example, silicon oxide ("SiOx"), silicon nitride ("SiNx"), silicon oxynitride ("SiNxOy"), or the like. The organic encapsulation layer OL may be disposed on the first inorganic encapsulation layer IL1. The organic encapsulation layer OL may have a flat top surface. For example, the organic encapsulation layer OL may be disposed to be relatively thicker than the first and second inorganic encapsulation layers IL1 and IL2; however, the present inventive concept is not limited thereto. The organic encapsulation layer OL may include, for example, a photoresist, a polyacrylic resin, a polyimide resin, an acrylic resin, and the like. The second inorganic encapsulation layer IL2 may be disposed on the organic encapsulation layer OL. The second inorganic encapsulation layer IL2 may include, for example, silicon oxide ("SiOx"), silicon nitride ("SiNx"), silicon oxynitride ("SiNxOy"), or the like.

The first and second inorganic encapsulation layers IL1 and IL2 may prevent oxygen and moisture from penetrating into the display device. Accordingly, the organic light emitting diode OLED may be protected. In addition, the first and second inorganic encapsulation layers IL1 and IL2 may protect the display device from external impact.

Figure 7A:
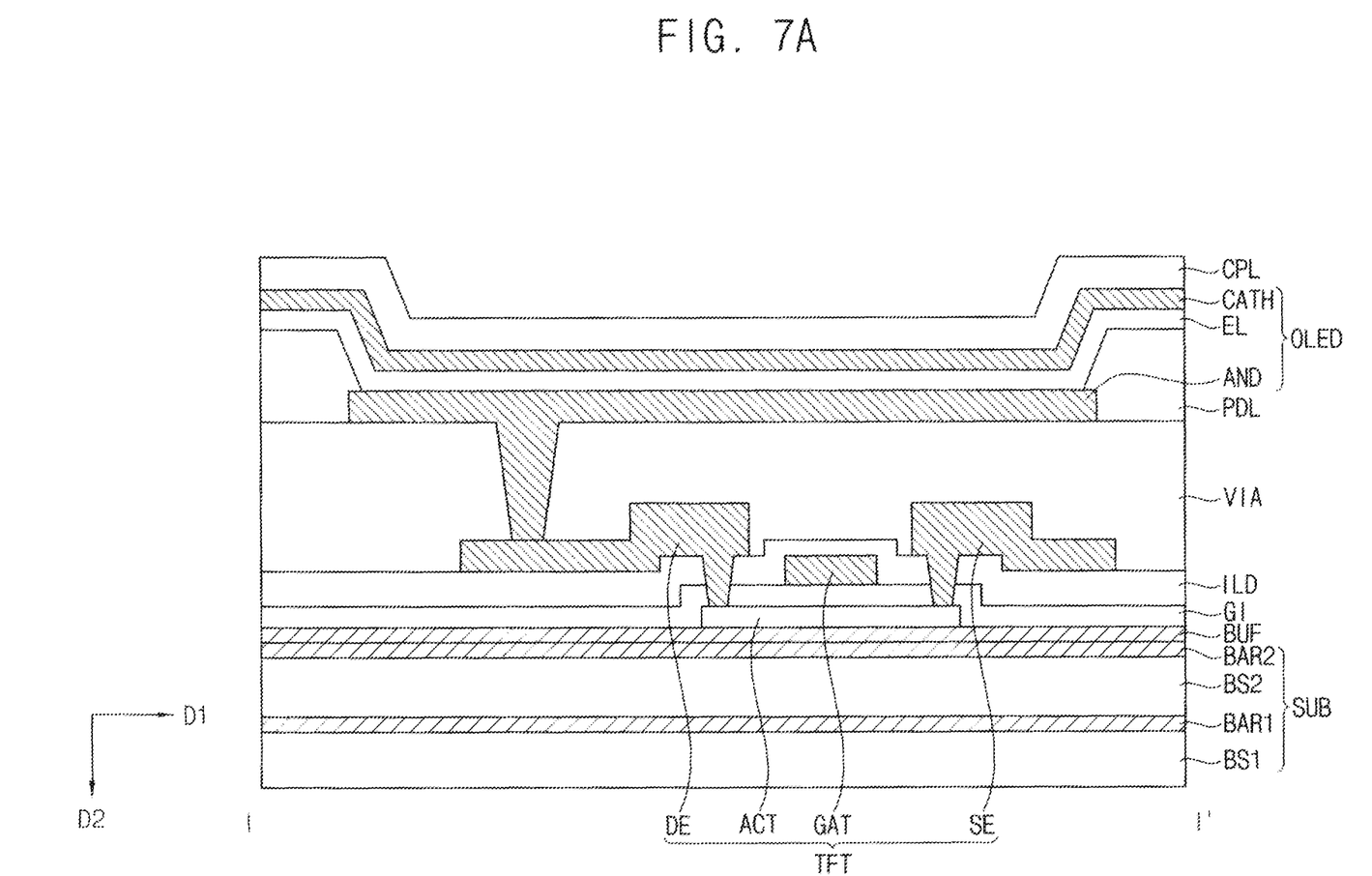
FIGS. 7A, 7B and 7C are diagrams illustrating a method of manufacturing the display device of FIG. 1 according to an embodiment of the present inventive concept.
Figure 7B:
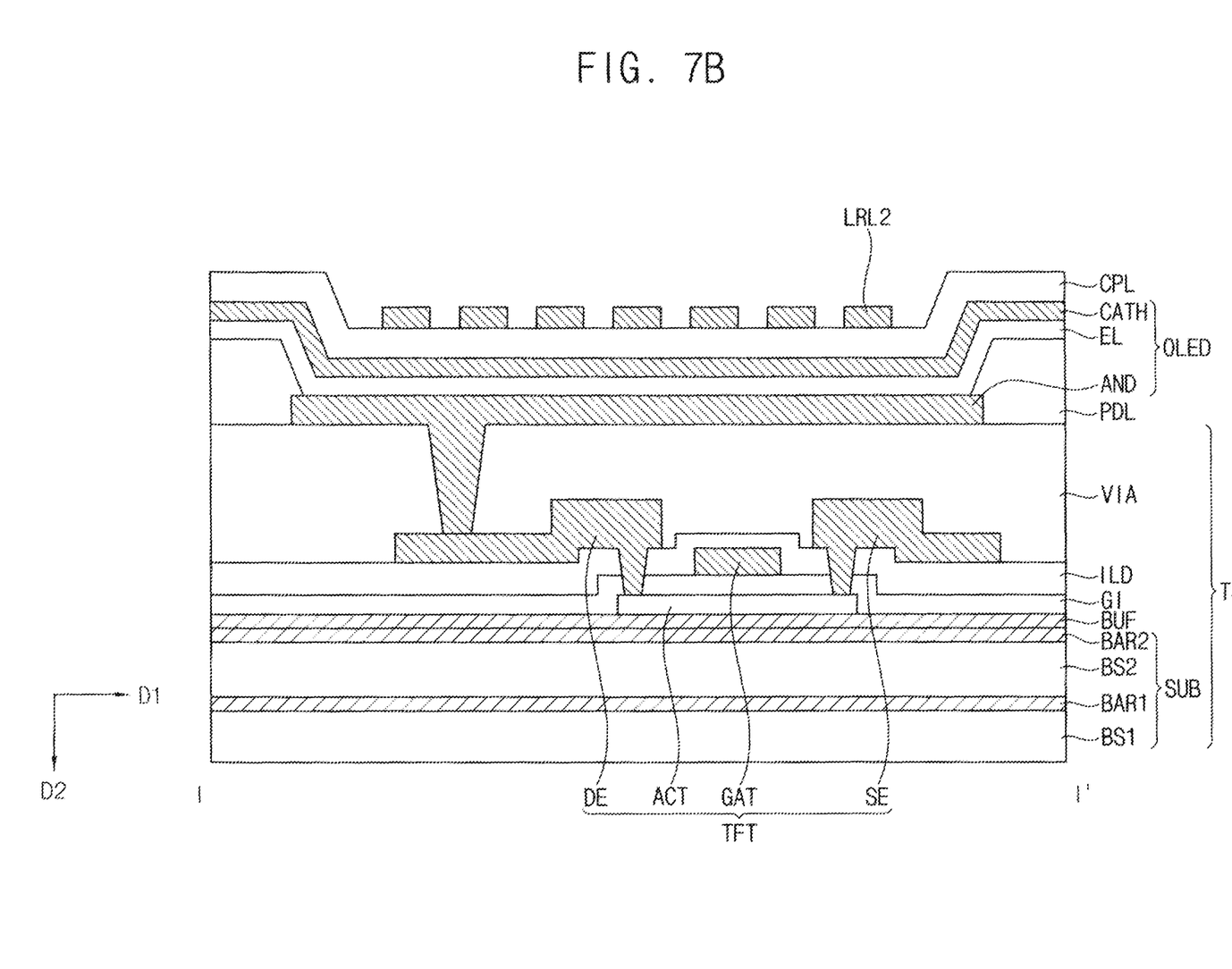
Figure 7C:
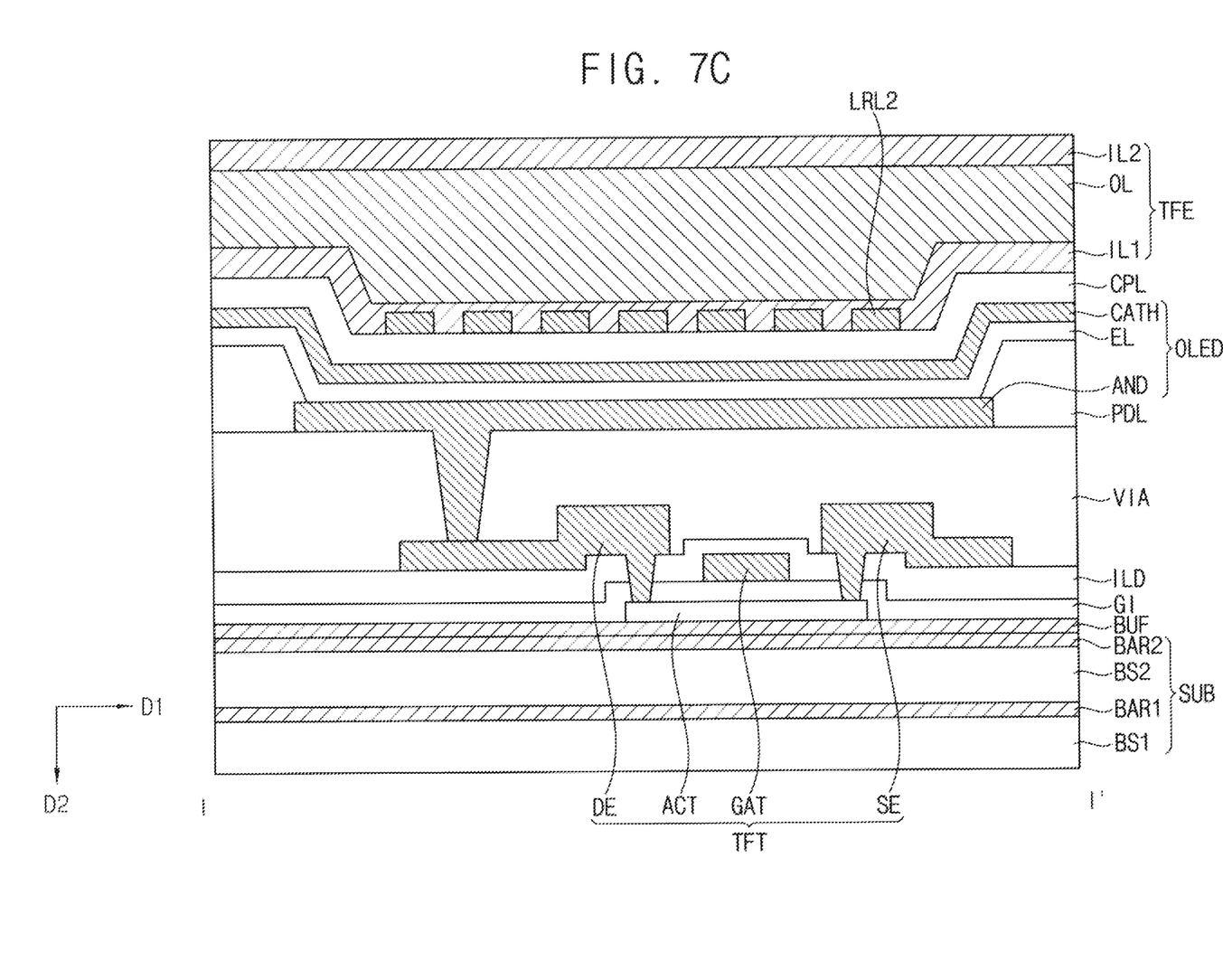

FIG. 7A to 7C are diagrams illustrating a method of manufacturing the display device of FIG. 1 according to an embodiment of the present inventive concept.

Referring to FIGS. 6 and 7A to 7C, a pixel including the transistor TFT and a light emitting diode may be formed on the substrate SUB. The light emitting diode may be the organic light emitting diode OLED, and may be connected to the transistor TFT.

The capping layer CPL may be formed on the organic light emitting diode OLED. The capping layer CPL may be formed on the cathode electrode CATH. For example, the capping layer CPL may be formed to be entirely disposed on the cathode electrode CATH.

Thereafter, the second metal layer LRL2 may be formed on the capping layer CPL. The second metal layer LRL2 may be formed on the capping layer CPL and then patterned. For example, the second metal layer LRL2 may be entirely formed on the capping layer CPL and then patterned. Accordingly, the second metal layer LRL2 may include a plurality of metal patterns spaced apart from each other in the first direction DR. As described above, the metal patterns may be spaced apart from each other by the same and/or different distances, and may have the same and/or different widths from each other. The second metal layer LRL2 may suppress reflection of external light incident from an outside of the display device and at the same time selectively transmits light emitted from a lower part to increase display quality of the display device.

The thin film encapsulation layer TFE may be disposed on the second metal layer LRL2 to protect the second metal layer LRL2. The thin film encapsulation layer TFE may be disposed to cover the second metal layer LRL2.

Figure 8:
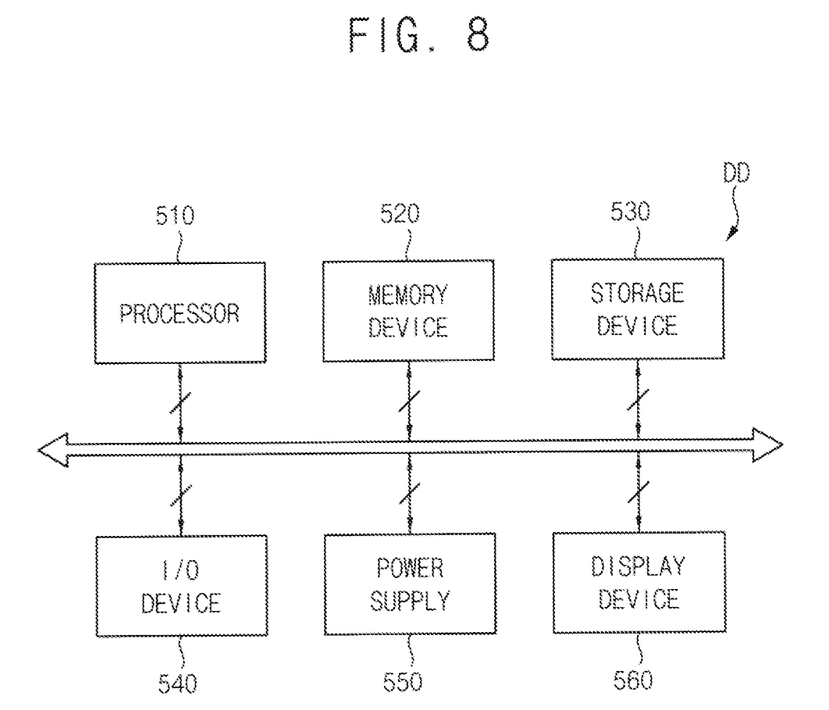
FIG. 8 is a block diagram illustrating an electronic device according to an embodiment of the present inventive concept.
Figure 9:
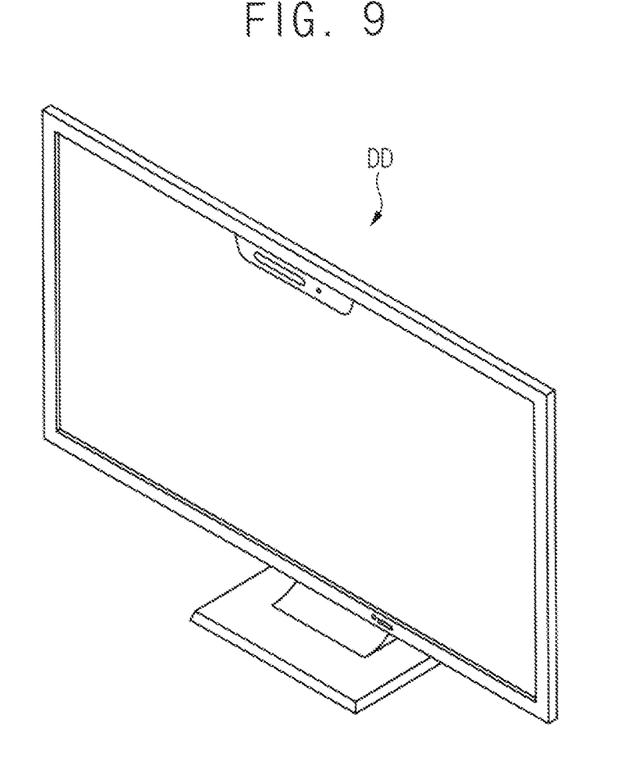
FIG. 9 is a diagram illustrating an embodiment in which the electronic device of FIG. 8 is implemented as a television.

FIG. 8 is a block diagram illustrating an electronic device according to an embodiment of the present inventive concept. FIG. 9 is a diagram illustrating an embodiment in which the electronic device of FIG. 8 is implemented as a television, and FIG. 10 is a diagram illustrating an embodiment in which the electronic device of FIG. 8 is implemented as a smart phone.

Figure 10:
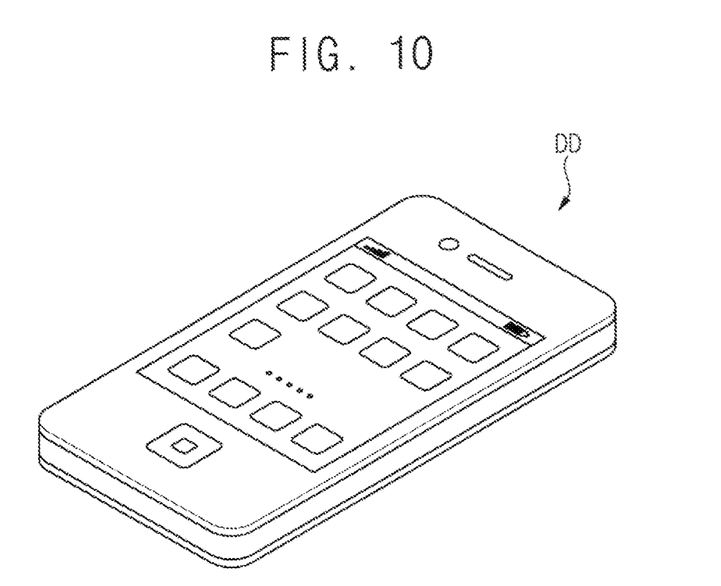
FIG. 10 is a diagram illustrating an embodiment in which the electronic device of FIG. 8 is implemented as a smart phone.

Referring to FIGS. 8 to 10, an electronic device DD may include a processor 510, a memory device 520, a storage device 530, an input/output device 540, a power supply 550, and a display device 560. In this case, the display device 560 may correspond to the display device, according to an embodiment of the present inventive concept, described with reference to the aforementioned drawings. The electronic device DD may further include several ports capable of communicating with, for example, a video card, a sound card, a memory card, a Universal Serial Bus (USB) device, and the like. In an embodiment of the present inventive concept, as illustrated in FIG. 9, the electronic device DD may be implemented as a television. In an embodiment of the present inventive concept, as illustrated in FIG. 10, the electronic device DD may be implemented as a smartphone. However, the electronic device DD is not limited thereto, and for example, the electronic device DD includes a mobile phone, a video phone, a smart pad, a smart watch, a tablet personal computer (PC), a vehicle navigation system. In addition, the electronic device may be implemented as, for example, a computer monitor, notebook computer, head mounted display (HMD), or the like.

The processor 510 may perform specific calculations or tasks. In an embodiment of the present inventive concept, the processor 510 may be, for example, a micro processor, a central processing unit (CPU), an application processor (AP), or the like. The processor 510 may be connected to other components through an address bus, a control bus, a data bus, or the like. In an embodiment of the present inventive concept, the processor 510 may also be connected to an expansion bus such as a peripheral component interconnect (PCI) bus.

The memory device 520 may store data necessary for the operation of the electronic device DD. For example, the memory device 520 may include a nonvolatile memory device such as an erasable programmable read-only memory (EPROM) device, an electrically erasable programmable read-only memory (EEPROM) device, a flash memory device, and a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and/or a volatile memory device such as a dynamic random access memory (DRAM) device, a static random access memory (SRAM) device, a mobile DRAM device.

The storage device 530 may include a solid state drive (SSD), a hard disk drive (HDD), a CD-ROM, or the like. The input/output device 540 may include an input means such as a keyboard, a keypad, a touch pad, a touch screen, and a mouse, and an output means such as a speaker and a printer.

The display device according to an embodiment of the present inventive concept may be applied to a display device included in, for example, a computer, a notebook, a mobile phone, a smart phone, a smart pad, a portable media player (PMP), a personal digital assistant (PDA), an MPEG-1 Audio Layer III (MP3) player, or the like.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A display device, comprising:
a plurality of light emitting diodes emitting light, wherein each of the plurality of light emitting diodes includes an anode electrode;
a capping layer disposed on the plurality of light emitting diodes and including an organic material; and
a plurality of metal patterns disposed on the capping layer and disposed above the plurality of light emitting diodes in a cross-sectional view,
wherein neighboring pairs of the plurality of metal patterns are separated from one another by spaces, and the spaces overlap the plurality of light emitting diodes,
wherein the plurality of metal patterns overlaps the anode electrode, and is arranged between opposing edges of the anode electrode.

2. The display device of claim 1, wherein the plurality of metal patterns include at least one of aluminum, silver, magnesium, chromium, titanium, nickel, silver, tantalum, copper, calcium, cobalt, iron, molybdenum, tungsten, platinum, ytterbium, or bismuth.

3. The display device of claim 1, wherein the plurality of metal patterns include at least one of silicon oxide, titanium oxide, zirconium oxide, tantalum oxide, hafnium oxide, aluminum oxide, zinc oxide, yttrium oxide, beryllium oxide, magnesium oxide, lead oxide, tungsten oxide, silicon nitride, lithium fluoride, calcium fluoride, magnesium fluoride or cadmium sulfide.

4. The display device of claim 1, wherein the plurality of light emitting diodes include:
a first light emitting diode emitting light of a first color;
a second light emitting diode emitting light of a second color; and
a third light emitting diode emitting light of a third color.

5. The display device of claim 4, wherein the plurality of metal patterns are arranged along a first direction and are spaced apart from each other in the first direction.

6. The display device of claim 5, wherein the plurality of metal patterns are arranged to overlap the first, second and third light emitting diodes.

7. The display device of claim 5, wherein a distance at which the plurality of metal patterns are separated from each other is about 1 micrometer or less.

8. The display device of claim 7, wherein each of the plurality of metal patterns has a same width in the first direction as each other, and the width is about 1 micrometer or less.

9. The display device of claim 5, wherein
among the plurality of metal patterns, a first plurality of metal patterns overlap the first light emitting diode, and each of the first plurality of metal patterns has a first width in the first direction,
among the plurality of metal patterns, a second plurality of metal patterns overlap the second light emitting diode, and each of the second plurality of metal patterns has a second width in the first direction,
among the plurality of metal patterns, a third plurality of metal patterns overlap the third light emitting diode, and each of the third plurality of metal patterns has a third width in the first direction, and
each of the first, second and third widths is about 1 micrometer or less.

10. The display device of claim 1, wherein a shortest distance between the plurality of metal patterns and the plurality of light emitting diodes is about 1 micrometer or less.

11. The display device of claim 1, further comprising:
a thin film encapsulation layer disposed on the plurality of metal patterns, and
wherein the thin film encapsulation layer includes:
a first inorganic encapsulation layer disposed on the plurality of metal patterns;
an organic encapsulation layer disposed on the first inorganic encapsulation layer; and
a second inorganic encapsulation layer disposed on the organic layer.

12. The display device of claim 1, wherein the capping layer includes an acrylic organic material.

13. A display device, comprising:
a plurality of light emitting diodes emitting a light;
a capping layer disposed on the plurality of light emitting diodes and including an organic material;
a plurality of metal patterns disposed on the capping layer and overlapping the plurality of light emitting diodes; and
a transistor substrate including a plurality of transistors, and electrically connected to the plurality of light emitting diodes disposed on the transistor substrate, and
wherein each of the plurality of light emitting diodes includes:
an anode electrode disposed on the transistor substrate;
a light emitting layer disposed on the anode electrode; and
a cathode electrode disposed on the light emitting layer.

14. A display device, comprising:
a plurality of light emitting diodes emitting a light;
a capping layer disposed on the plurality of light emitting diodes and including an organic material; and
a plurality of metal patterns disposed on the capping layer and overlapping the plurality of light emitting diodes, wherein each of the plurality of metal patterns includes an upper surface and a lower surface, wherein an external light incident on the plurality of metal patterns is reflected as a first reflected light from the upper surface, wherein the external light is reflected as a second reflected light from the lower surface, and wherein the first reflected light and the second reflected light interfere with each other.

* * * * *